United States Patent
Lai et al.

(10) Patent No.: US 10,985,101 B2
(45) Date of Patent: Apr. 20, 2021

(54) SEMICONDUCTOR PACKAGE AND MANUFACTURING METHOD THEREOF

(71) Applicant: Taiwan Semiconductor Manufacturing Co., Ltd., Hsinchu (TW)

(72) Inventors: Yu-Chia Lai, Miaoli County (TW); Chi-Hui Lai, Taichung (TW); Tin-Hao Kuo, Hsinchu (TW); Hao-Yi Tsai, Hsinchu (TW); Chung-Shi Liu, Hsinchu (TW); Kuo-Chung Yee, Taoyuan (TW); Chen-Hua Yu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/354,105

(22) Filed: Mar. 14, 2019

(65) Prior Publication Data
US 2020/0294916 A1    Sep. 17, 2020

(51) Int. Cl.
| | |
|---|---|
| *H01L 23/48* | (2006.01) |
| *H01L 23/528* | (2006.01) |
| *H01L 23/522* | (2006.01) |
| *H01L 23/538* | (2006.01) |
| *H01L 25/065* | (2006.01) |

(Continued)

(52) U.S. Cl.
CPC ........ *H01L 23/5283* (2013.01); *H01L 21/563* (2013.01); *H01L 23/3171* (2013.01); *H01L 23/5226* (2013.01); *H01L 23/5383* (2013.01); *H01L 23/5386* (2013.01); *H01L 24/09* (2013.01); *H01L 24/17* (2013.01); *H01L 24/32* (2013.01); *H01L 24/73* (2013.01); *H01L 25/0655* (2013.01); *H01L 2224/02373* (2013.01); *H01L 2224/02379* (2013.01);

(Continued)

(58) Field of Classification Search
CPC ............ H01L 23/5283; H01L 23/5386; H01L 23/5383; H01L 23/5226; H01L 25/0655; H01L 2224/02373
USPC .................................................. 257/723, 778
See application file for complete search history.

(56) References Cited

U.S. PATENT DOCUMENTS 5,640,048 A  *  6/1997  Selna ................. H01L 23/3128
                                                         257/738
6,897,555 B1 *  5/2005  Lim ........................ H01L 23/50
                                                         257/692

(Continued)

*Primary Examiner* — Nitin Parekh
(74) *Attorney, Agent, or Firm* — JCIPRNET

(57) ABSTRACT

A semiconductor package and a manufacturing method thereof are provided. The semiconductor package includes semiconductor dies, an encapsulant and a redistribution structure. The semiconductor dies are disposed side by side. Each semiconductor die has an active surface, a backside surface, and an inner side surface connecting the active surface and the backside surface. The encapsulant wraps the semiconductor dies and exposes the active surfaces of the semiconductor dies. The redistribution structure is disposed on the encapsulant and the active surfaces of the semiconductor dies. The inner side surfaces of most adjacent semiconductor dies face each other. The redistribution structure establishes single-ended connections between most adjacent semiconductor dies by crossing over the facing inner side surfaces of the most adjacent semiconductor dies.

19 Claims, 17 Drawing Sheets

(51) Int. Cl.
    *H01L 21/56*      (2006.01)
    *H01L 23/00*      (2006.01)
    *H01L 23/31*      (2006.01)
(52) U.S. Cl.
    CPC ............ *H01L 2224/02381* (2013.01); *H01L 2224/0401* (2013.01); *H01L 2224/73253* (2013.01)

(56) References Cited

U.S. PATENT DOCUMENTS

| | | | |
|---|---|---|---|
| 7,368,374 B2 * | 5/2008 | Chia | H01L 23/525 |
| | | | 438/613 |
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 2008/0157341 A1 * | 7/2008 | Yang | H01L 24/82 |
| | | | 257/700 |
| 2009/0020864 A1 * | 1/2009 | Pu | H01L 23/3107 |
| | | | 257/687 |
| 2011/0068461 A1 * | 3/2011 | England | H01L 24/97 |
| | | | 257/700 |
| 2011/0304349 A1 * | 12/2011 | Stillman | H01L 23/49827 |
| | | | 324/756.02 |
| 2016/0079196 A1 * | 3/2016 | Teh | H01L 23/50 |
| | | | 257/774 |

* cited by examiner

SEMICONDUCTOR PACKAGE AND MANUFACTURING METHOD THEREOF

BACKGROUND

Contemporary high performance computing systems consisting of one or more electronic devices are widely used in a variety of advanced electronic applications. When integrated circuit components or semiconductor chips are packaged for these applications, one or more chips are generally bonded to a circuit carrier (e.g., a system board, a printed circuit board, or the like) for electrical connections to other external devices or electronic components. To respond to the increasing demand for miniaturization, higher speed and better electrical performance (e.g., lower transmission loss and insertion loss), more creative packaging and assembling techniques are actively researched.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
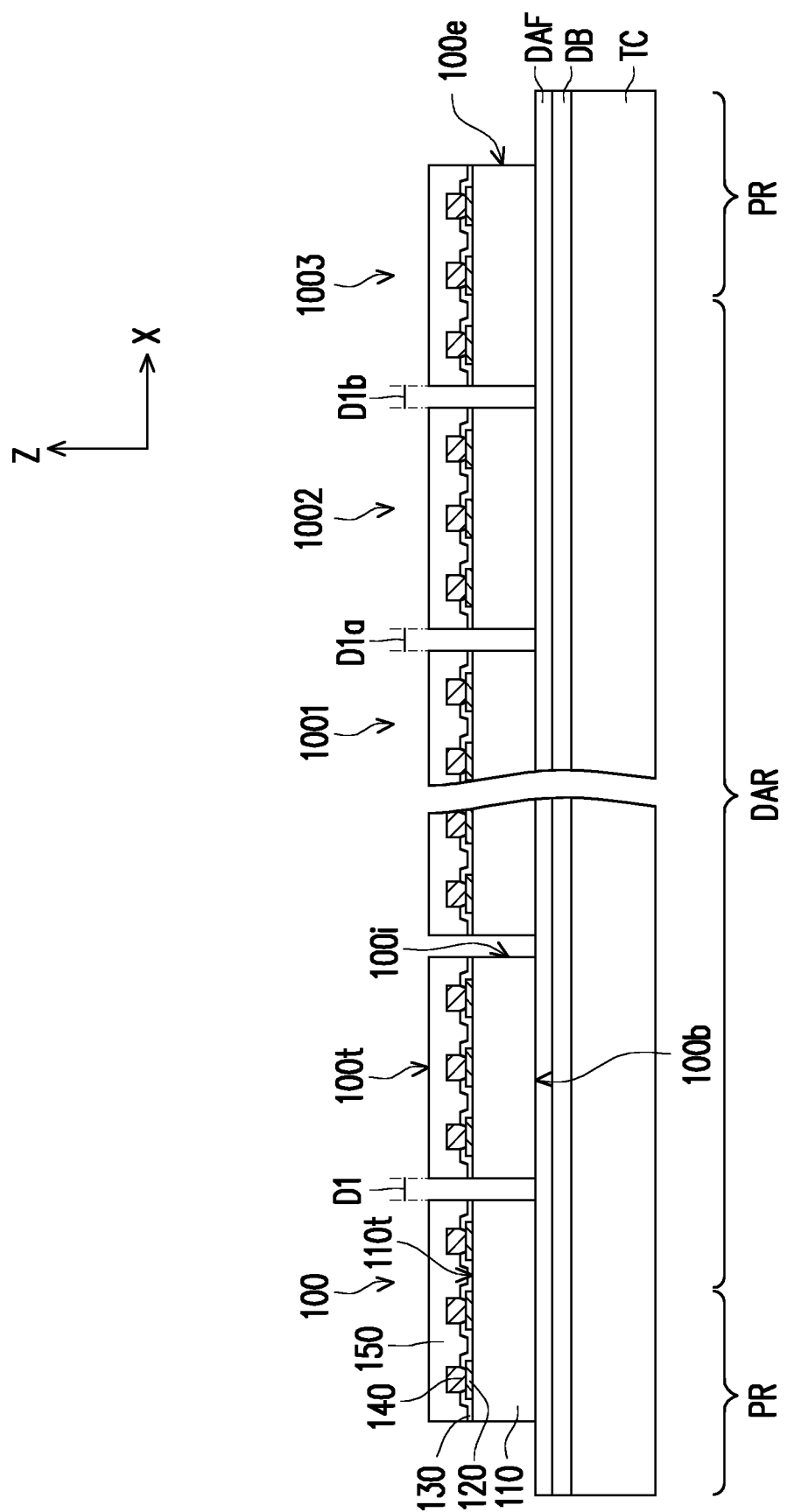
FIG. 1A through FIG. 1I are schematic cross-sectional views of structures produced at various stages of a manufacturing method of a semiconductor package according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A through FIG. 1I are schematic cross-sectional views of structures produced at various stages of a manufacturing method of a semiconductor package 10 (shown in FIG. 1I) according to some embodiments of the present disclosure. The cross-sectional views of FIG. 1A through FIG. 1I may be taken in a plane defined by a thickness direction Z of the structures shown and by a first direction X of a plane XY normal to the thickness direction Z. The plane XY may be defined by the first direction X and a second direction Y (shown in FIG. 2) perpendicular to the first direction X, where both directions X and Y are normal with respect to the thickness direction Z. Referring to FIG. 1A, a temporary carrier TC is provided. In some embodiments, the temporary carrier TC is a glass substrate, a metal plate, a plastic supporting board or the like, but other suitable substrate materials may be used as long as the materials are able to withstand the subsequent steps of the process. In some embodiments, a de-bonding layer DB is provided on the temporary carrier TC to facilitate peeling the temporary carrier TC away from the structure when required by the manufacturing process. In some embodiments, the de-bonding layer DB includes a light-to-heat conversion (LTHC) release layer.

A die attach film DAF may be disposed over the temporary carrier TC on the debonding layer DB, as shown in FIG. 1A. In some embodiments, the die attach film DAF comprises a thermoplastic material, a thermocurable material, or a photocurable material. The die attach film DAF may comprise epoxy resins, phenol resins, polyolefins, or other suitable materials. However, the disclosure is not limited thereto, and other materials or polymers compatible with semiconductor processing environments may be used. The die attach film DAF may be applied to the temporary carrier TC via lamination, spin-coating, or other suitable techniques.

In some embodiments, semiconductor dies 100 are disposed side by side over the temporary carrier TC with a pick-and-place process. In some embodiments, the semiconductor dies 100 include a semiconductor substrate 110, one or more contact pads 120, and a passivation layer 130. The contact pads 120 may be formed on a top surface 110$t$ of the semiconductor substrate 110. The passivation layer 130 may cover the top surface 110*t* and have a plurality of openings that exposes at least a portion of each contact pad 120. In some embodiments, the semiconductor dies 100 further include a plurality of conductive posts 140 filling the openings of the passivation layer 130 and electrically connected to the contact pads 120, and a protective layer 150 surrounding the conductive posts 140. In some embodiments the protective layer 150 may completely cover the conductive posts 140 and (temporarily) constitute a top surface 100*t* of the semiconductor die 100. In some embodiments, the semiconductor dies 100 are placed on the die attach film DAF with the top surfaces 110*t* of the semiconductor substrates 110 facing away from the temporary carrier TC. Backside surfaces 100*b* of the semiconductor dies 100 opposite to the top surface 110*t* may be in contact with the die attach film DAF. In some embodiments, the semiconductor dies 100 included in a semiconductor package may have different sizes, or components of different sizes. For example, the semiconductor dies 100 may differ for the thickness of the semiconductor substrate 110, the number of contact pads 120, whether conductive posts 140 are included or not, and so on.

In some embodiments, the semiconductor substrate 110 is made of semiconductor materials, such as semiconductor materials of the groups III-V of the periodic table. In some embodiments, the semiconductor substrate 110 includes elementary semiconductor materials such as silicon or germanium, compound semiconductor materials such as silicon carbide, gallium arsenide, indium arsenide, or indium phosphide or alloy semiconductor materials such as silicon germanium, silicon germanium carbide, gallium arsenide phosphide, or gallium indium phosphide. In some embodiments, the semiconductor substrate 110 includes active components (e.g., transistors or the like) and optionally passive components (e.g., resistors, capacitors, inductors, or the like) formed therein. In certain embodiments, the contact pads 120 include aluminum pads, copper pads, or other suitable metal pads. In some embodiments, the passivation layer 130 may be a single layer or a multi-layered structure, including a silicon oxide layer, a silicon nitride layer, a silicon oxy-nitride layer, a dielectric layer formed by other suitable dielectric materials or combinations thereof. In some embodiments, the material of the conductive posts 140 includes copper, copper alloys, or other conductive materials, and may be formed by deposition, plating, or other suitable techniques.

Each semiconductor die 100 may independently be or include a logic die, such as a central processing unit (CPU) die, a graphic processing unit (GPU) die, a micro control unit (MCU) die, an input-output (I/O) die, a baseband (BB) die, or an application processor (AP) die. In some embodiments, some semiconductor dies 100 may be a memory die. The disclosure is not limited by the type of dies used for the semiconductor dies 100.

Figure 2:
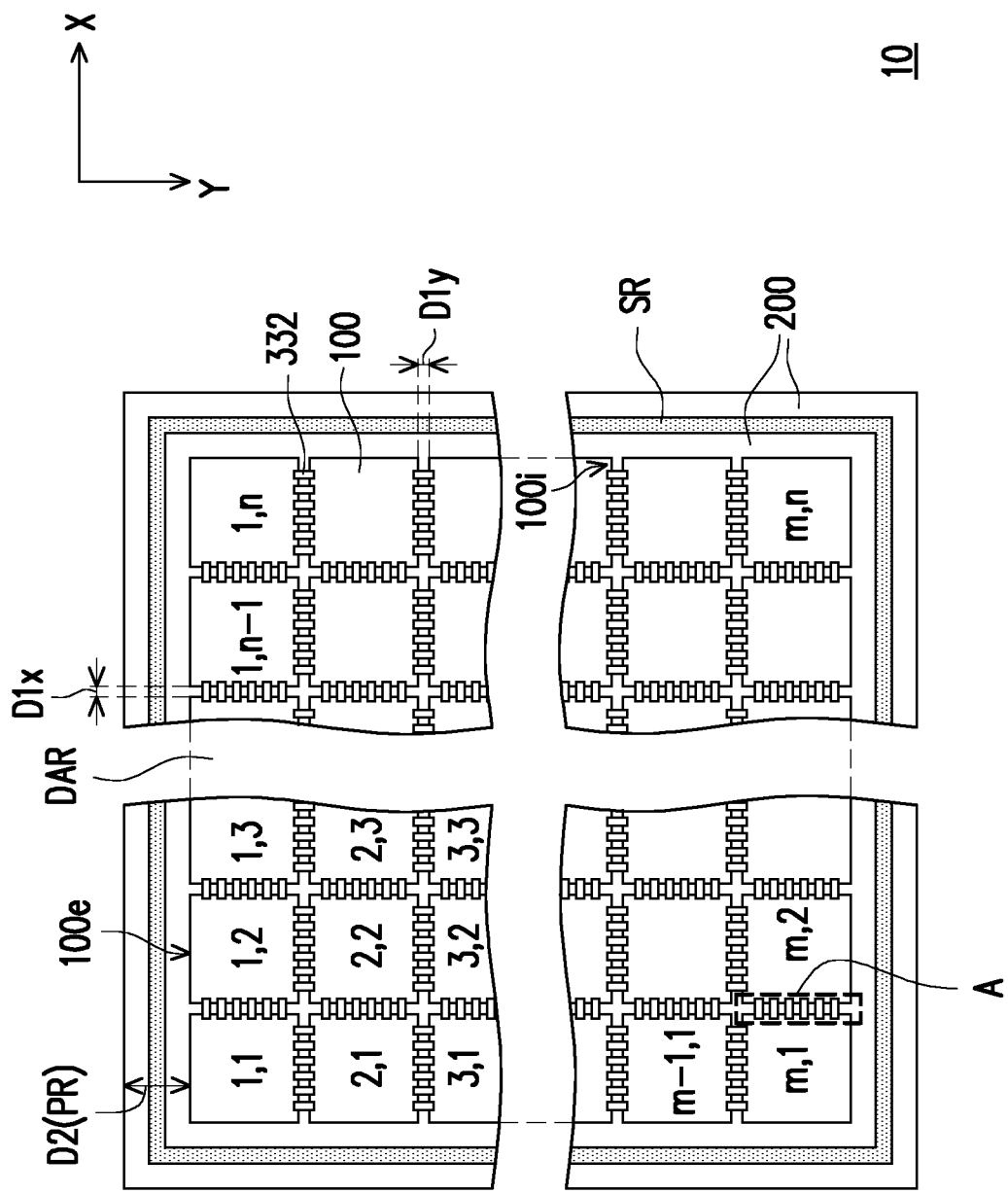
FIG. 2 is a schematic top view of a semiconductor package according to some embodiments of the present disclosure.

In some embodiments, the semiconductor dies 100 are disposed adjacent to each other along the first direction X and the second direction Y (shown in FIG. 2). In some embodiments, a distance D1 separating most adjacent semiconductor dies 100 may be below 50 micrometers. In some embodiments, the distance D1 between most adjacent semiconductor dies 100 may be in the range from 30 micrometers to 70 micrometers. For example, given three semiconductor dies 1001, 1002, 1003 aligned along the first direction X and adjacent to each other, a distance D1*a* separating the semiconductor die 1001 from the semiconductor die 1002 and a distance D1*b* separating the semiconductor die 1002 from the semiconductor die 1003, may both be in the range from 30 micrometers to 70 micrometers, but the disclosure is not limited thereto. In some embodiments, the distances D1*a* and D1*b* may be substantially equal, but the disclosure is not limited thereto. In some alternative embodiments, the distances D1*a* and D1*b* may differ. In some embodiments, the distance D1 may be measured between opposite inner side surfaces 100*i* of most adjacent semiconductor dies 100. In some embodiments, side surfaces of a semiconductor die 100 joins the top surface 100*t* of a semiconductor die 100 with the backside surface 100*b* of the same semiconductor die 100. In some embodiment, a side surface of a semiconductor die 100 is considered an inner side surface 100*i* if it faces another semiconductor die 100, whilst it is considered an outer side surface 100*e* if it does not face another semiconductor die 100. In some embodiments, when the semiconductor dies 100 have a square or rectangular footprint, each semiconductor die 100 may have between two to four inner side surfaces 100*i*, and between zero to two outer side surfaces 100*e*, depending on the position occupied within the semiconductor package being formed. In some embodiments, the semiconductor dies 100 are arranged in an array including a plurality of rows and columns, with rows and columns extending along perpendicular directions. Only for the purpose of illustration, in the present disclosure rows are illustrated extending along the first direction X and columns are illustrated extending along the second direction Y. In some embodiments, the inner side surfaces 100*i* and the outer side surfaces 100*e* of the semiconductor dies 100 extend in planes defined by the first direction X or the second direction Y with the thickness direction Z. That is, some side surfaces 100*i* or 100*e* may extend in the XZ plane and some other side surfaces 100*i* or 100*e* may extend in the YZ plane. In some embodiments, when a semiconductor die 100 has a square footprint, two side surfaces may extend in the XZ plane and two side surfaces may extend in the YZ plane. However, the disclosure is not limited thereto. In some embodiments, the footprint of a semiconductor die 100 in the plane XY may be of expressed in terms of the dimension (length) of one side surface 100*i* or 100*e* along the first direction X multiplied by the dimension (length) of another side surface 100*i* or 100*e* along the second direction Y. For example, if a semiconductor die 100 is described as having a footprint of 20 mm×25 mm, it means that dimension of one of its side surfaces 100*i* or 100*e* extending in the first direction X is 20 mm, and the size of another side surface 100*i* or 100*e* perpendicular to the first one and extending in the second direction Y is 25 mm. In some embodiments, the size of each side surface 100*i* or 100*e* may independently be in the range from 0.1 to 30 mm.

In some embodiments, the semiconductor dies 100 are disposed in a central region of the temporary carrier TC, corresponding to a die attach region DAR of the finished semiconductor package. A border of the die attach region DAR may be defined by the outer side surfaces 100*e* of the semiconductor dies 100. The die attach region DAR may be surrounded by a peripheral region PR in which no semiconductor die 100 is disposed. In some embodiments, the peripheral region PR extends from the die attach region DAR until the edge E (shown in FIG. 1I) of the finished semiconductor package. In some embodiments, all the semiconductor dies 100 disposed over the temporary carrier TC are included in the finished semiconductor package 10 (shown in FIG. 1I).

Figure 1B:
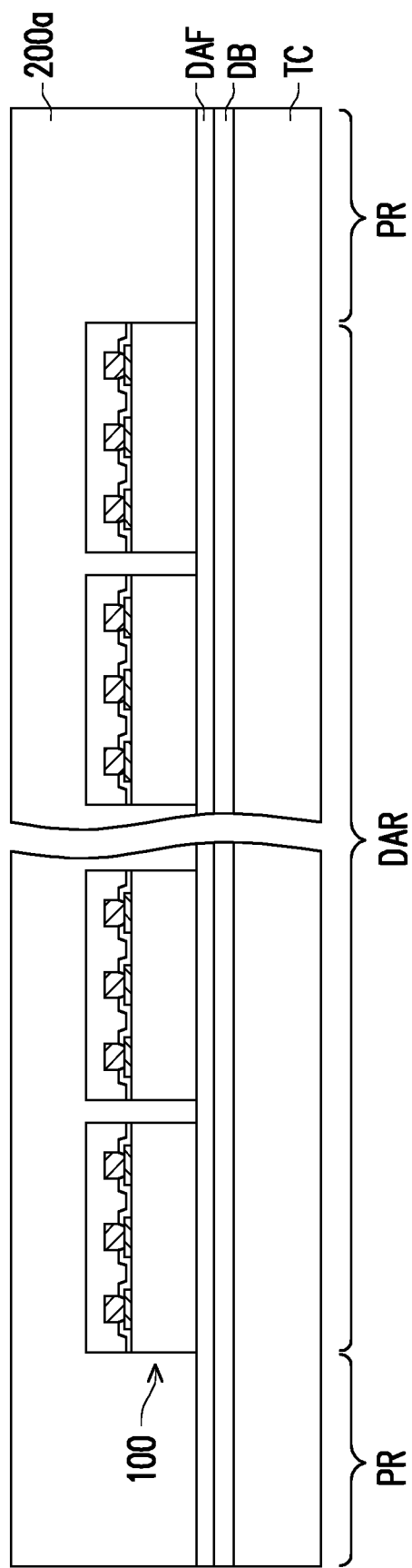

Referring to FIG. 1B, an encapsulating material 200*a* is formed over the temporary carrier TC to encapsulate the semiconductor dies. In some embodiments, the semiconductor dies 100 are fully covered and not revealed by the encapsulating material 200a. In some embodiments, the encapsulating material 200a may be a molding compound, a molding underfill, a resin (such as an epoxy resin), or the like. In some embodiments, the encapsulating material 200a is formed by an over-molding process. In some embodiments, the encapsulating material 200a is formed by a compression molding process. In some embodiments, as shown in FIG. 1B, the encapsulating material 200a may extend all over the temporary carrier TC.

Figure 1C:
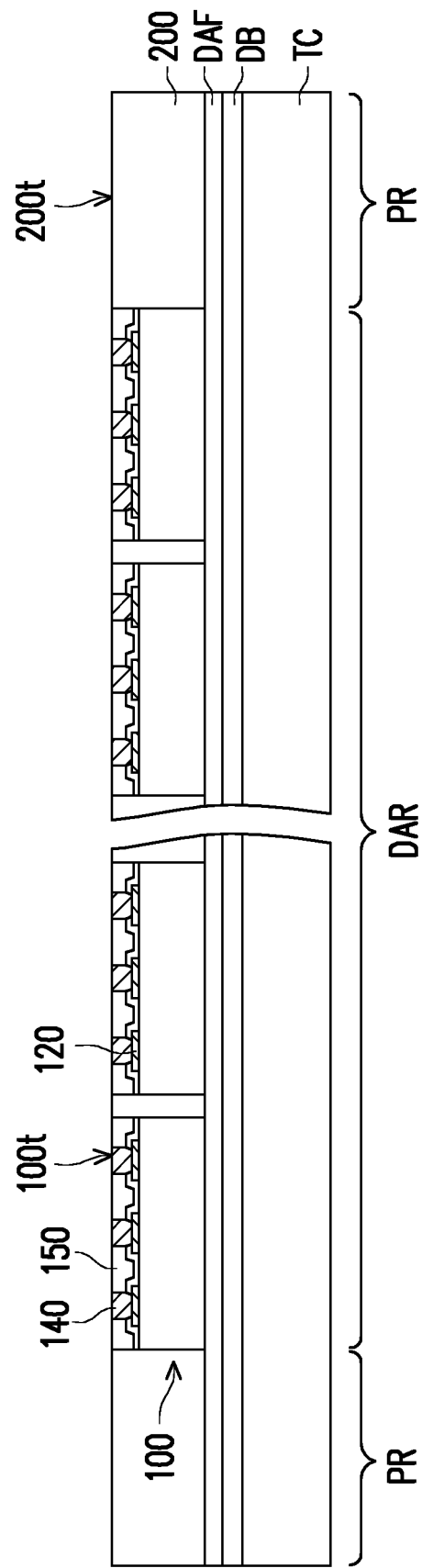

Referring to FIG. 1B and FIG. 1C, in some embodiments, the encapsulating material 200a is partially removed by a planarization process until the conductive posts 140 of the semiconductor dies 100 are exposed. In some embodiments, a portion of the protective layer 150 may be removed during the planarization process to expose the conductive posts 140. In some embodiments, portions of the conductive posts 140 are removed during the planarization step. Planarization of the encapsulating material 200a may produce an encapsulant 200 that surrounds the semiconductor dies 100. Following planarization, top surfaces 100t of the semiconductor dies 100 may be defined by the protective layers 150 and the conductive posts 140. That is, following the planarization step, the conductive posts 140 (or the conductive pads 120) may be exposed and available for electrically connecting the semiconductor dies 100 to subsequently formed components or elements. In some embodiments, the top surfaces 100t of the semiconductor dies 100 exposing the conductive posts 140 (or the conductive pads 120 if the conductive posts 140 are not included) are also indicated as active surfaces. In some embodiments, the active surfaces 100t of the semiconductor dies 100 may be substantially coplanar with a top surface 200t of the encapsulant 200. In some embodiments, the planarization of the encapsulating material 200a includes performing a mechanical grinding process and/or a chemical mechanical polishing (CMP) process. In some embodiments, as shown in FIG. 1C, the encapsulant 200 fills the interstices between the semiconductor dies 100 (the distances D1 shown in FIG. 1A) and further extends over the peripheral region PR of the semiconductor package being formed.

Figure 1D:
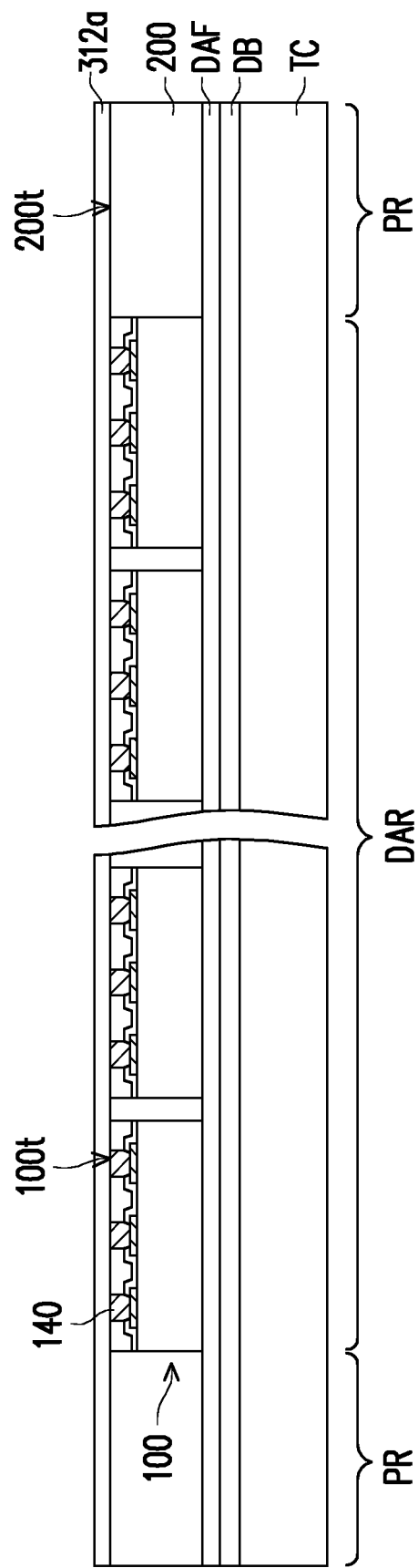
Figure 1E:
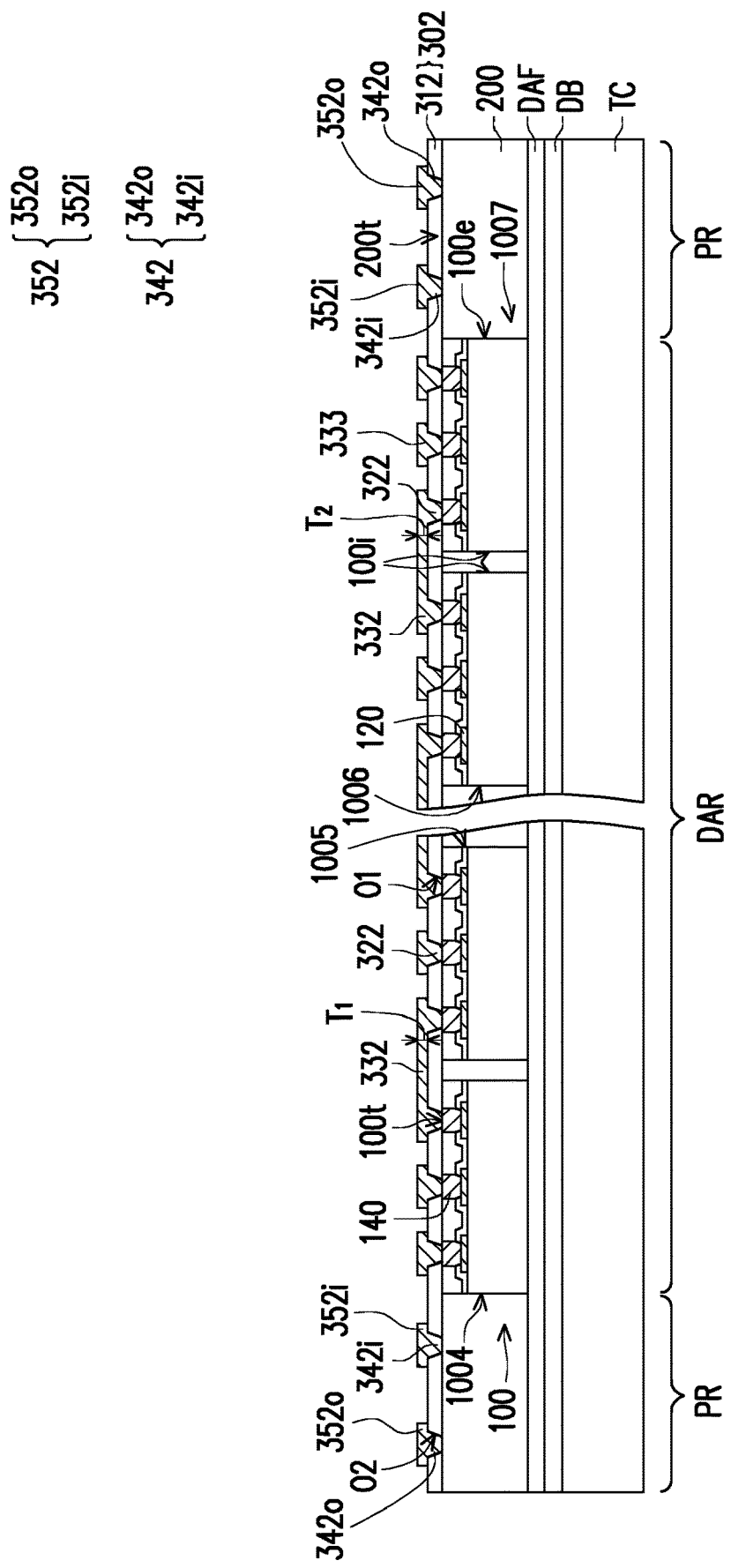

In some embodiments, referring to FIG. 1D, a first dielectric material layer 312a is blanketly formed over the active surfaces 100t of the semiconductor dies 100 and the top surface 200t of the encapsulant 200. In some embodiments, the first dielectric material layer 312a leaves unexposed both the encapsulant 200 and the conductive posts 140. In some embodiments, the material of the first dielectric material layer 312a includes polyimide, epoxy resin, acrylic resin, phenol resin, benzocyclobutene (BCB), polybenzooxazole (PBO), or any other suitable polymer-based dielectric material. In some embodiments, the first dielectric material layer 312a may be formed by suitable fabrication techniques such as spin-on coating, chemical vapor deposition (CVD), plasma-enhanced chemical vapor deposition (PECVD), or the like. Referring to FIG. 1D and FIG. 1E, the first dielectric material layer 312a may be patterned to form a first dielectric layer 312 including first openings O1 over the semiconductor dies 100 in the die attach region DAR and second openings O2 over the encapsulant in the peripheral region PR. In some embodiments, the first openings O1 expose portions of the conductive posts 140 (or the contact pads 120) of the semiconductor dies 100, whilst the second openings O2 expose the underlying encapsulant 200. In some embodiments, the first openings O1 and the second openings O2 may be formed via a sequence of photolithography and etching steps, possibly employing auxiliary mask (e.g., photoresist). In some embodiments, the openings O1 and O2 are formed by laser drilling or other suitable techniques. First conductive vias 322 may be formed in the openings O1 to establish electrical connection with the semiconductor dies 100. First conductive patterns 332 may be formed over the first dielectric layer 312 and be electrically connected to the semiconductor dies 100 via the first conductive vias 322. In some embodiments, the first conductive patterns 332 extend within the die attach region DAR and connects one of the semiconductor dies 100 with most adjacent semiconductor dies 100. In the present embodiment, most adjacent semiconductor dies 100 are considered semiconductor dies 100 having inner side surfaces 100i facing each other without intervening semiconductor dies 100. Most adjacent semiconductor dies 100 may be semiconductor dies disposed next to each other. In some embodiments, multiple first conductive patterns 332 connect a pair of most adjacent semiconductor dies 100 according to a single-ended signaling scheme. In single-ended signaling, the semiconductor die 100 transmitting a signal generates a voltage that the receiving semiconductor die 100 compares with a fixed reference voltage. Both the voltage signal and the receiving signal are referenced with respect to a common ground connection shared by the transmitting semiconductor die 100 and the receiving semiconductor die 100. In some embodiments, the first conductive patterns 332 cross over the inner side surfaces 100i of the semiconductor dies 100, but do not cross over the outer side surfaces 100e of the semiconductor dies 100. That is, the first conductive patterns 332 may be located within the die attach region DAR. However, the disclosure is not limited thereto. In some alternative embodiments, the first conductive patterns 332 cross over the outer side surfaces 100e of the semiconductor dies 100 and run also within the peripheral region PR. In some embodiments, first conductive patterns 332 interconnecting a given pair of opposite semiconductor dies 100 have substantially the same thickness. For example, most adjacent semiconductor dies 1004 and 1005 may be interconnected by multiple first conductive patterns 332 having substantially the same thickness T1, with a tolerance of about 10%. The thickness of a first conductive pattern 332 is measured on a portion of the first conductive pattern 332 running over the underlying first dielectric layer 312, rather than over the conductive vias 322. In some embodiments, the thickness T1 of the first conductive patterns 332 interconnecting the semiconductor dies 1004 and 1005 may be the same as the thickness T2 interconnecting the semiconductor dies 1006 and 1007, but the disclosure is not limited thereto. In some embodiments, first conductive pads 333 may be formed over the first conductive vias 322 which are not connected to the first conductive patterns 332. In some embodiments, the first dielectric layer 312, the first conductive vias 322, the first conductive patterns 332 and the first conductive pads 333 may be considered a first redistribution layer 302 of the redistribution structure 300 (shown in FIG. 1G). In some embodiments, the first conductive pads 333 may constitute landing pads for subsequently formed conductive vias to connect the semiconductor dies 100 with higher layer of the redistributions structure 300 being formed. In some embodiments, materials of the first conductive patterns 332, the first conductive pads 333 and of the first conductive vias 322 include aluminum, titanium, copper, nickel, tungsten, alloys or combination thereof. The first conductive patterns 332, the first conductive pads 333 and the first conductive vias 322 may be formed by, for example, electroplating, deposition, and/or photolithography and etching.

In some embodiments, as shown in FIG. 1E, a first portion of the second openings O2 may be disposed closer to the border of the die attach region DAR, in between the die attach region DAR and another portion of the second openings O2 disposed closer to an outer edge of the peripheral region PR. Seal vias 342 (e.g. seal vias 342i, 342o) connected to seal patterns 352 (e.g. patterns 352i, 352o) may be formed in the second openings O2 in the peripheral region PR, the seal patterns 352 being stacked on top of the seal vias 342. In some embodiments, the seal vias 342 and the seal patterns 352 are electrically insulated from the semiconductor dies 100. In some embodiments, the seal vias 342i disposed in the first portion of the second openings O2 closer to the semiconductor dies 100 and the seal patterns 352i formed thereon constitute a first layer of an inner seal ring SRi (shown in FIG. 1F), whilst the seal vias 342o formed in the second portion of the second openings O2 and the seal patterns 352o formed thereon constitute a first layer of an outer seal ring SRo (shown in FIG. 1F). In some embodiments, the seal vias 342 and the seal patterns 352 may be formed following similar methods and employing similar material as previously described for the first conductive vias 322, the first conductive patterns 332 and the first conductive pads 333. In some embodiments, the seal vias 342 and the seal patterns 352 may be formed simultaneously with the first conductive patterns 332, the first conductive vias 322 and the first conductive pads 333. In some embodiments, no interface is visible between the first conductive via 322 and the overlying first conductive pattern 332 or the overlying first conductive pad 333. Similarly, no interface may be visible between the first seal vias 342 and the first seal patterns 352.

Figure 1F:
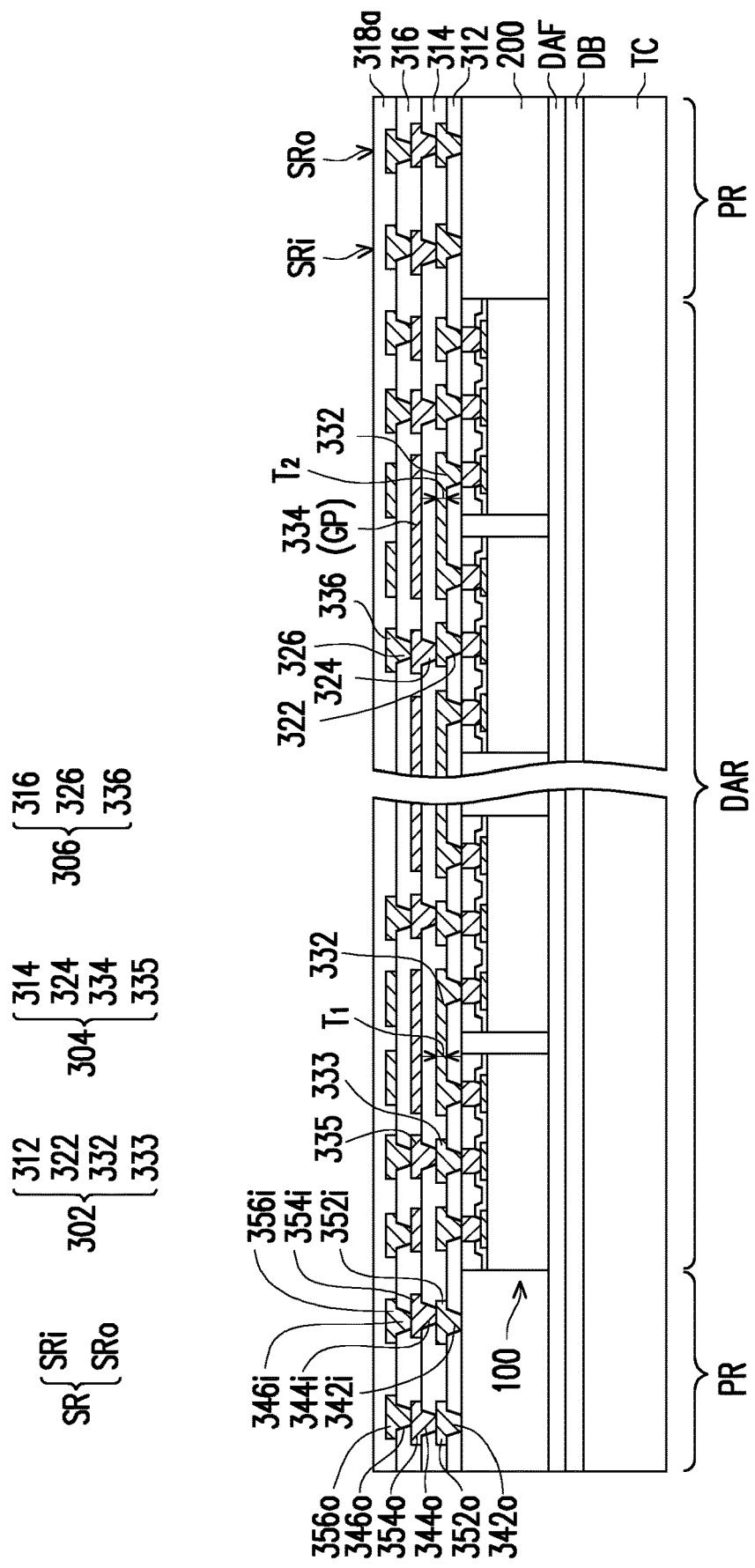

In some embodiments, referring to FIG. 1F, higher redistribution layers 304, 306 of the redistribution structure 300 (shown in FIG. 1G) may be formed following similar processes as previously described for the first redistribution layer 302. Multiple dielectric layers 314, 316, may be stacked over the first dielectric layer 312. Conductive patterns 334, 336 may be stacked alternately with the newly formed dielectric layers 314, 316, and be connected to the semiconductor dies 100 via conductive vias 324, 326 embedded in the dielectric layers 314, 316. In more detail, in some embodiments, the first conductive patterns 332 may be disposed between the first dielectric layer 312 and the second dielectric layer 314 stacked on top of the first dielectric layer 312; second conductive patterns 334 may be disposed between the second dielectric layer 314 and the third dielectric layer 316 stacked on top of the second dielectric layer 314, and so on. In some embodiments, the thickness T1 or T2 of the first conductive patterns 332 is measured in correspondence of portions of the first conductive patterns 332 running over the first dielectric layer 332 and below the second dielectric layer 314. That is, the thickness T1 or T2 of the first conductive patterns 332 may not be measured where the first conductive patterns 332 contact one of the conductive vias 322 (or, in some embodiments, 324). In some embodiments, the second conductive patterns 334 joins together to form a ground plane GP for the semiconductor dies 100. The conductive vias 324 may be formed in openings of the second dielectric layer 314. A portion of the conductive vias 324 may connect a portion of the first conductive pads 333 to the ground plane GP formed by the second conductive patterns 334 in order to ground the semiconductor dies 100 to which the first conductive pads 333 are connected. Another portion of the conductive vias 324 may connect another portion of the first conductive pads 333 to second conductive pads 335. The second conductive pads 335 may be formed on top of the second conductive vias 324 and be not directly connected to the second conductive patterns 334 constituting the ground plane GP. In other words, a portion of the conductive vias 324 may be used to connect the semiconductor dies 100 to the ground plane GP and a second portion of the conductive vias 324 may be used to connect the semiconductor dies to higher redistribution layers (e.g., 306) of the redistribution structure 300 being formed. Third conductive patterns 336 may be disposed between the third dielectric layer 316 and an outermost dielectric material layer 318a. The third conductive patterns 336 may be connected to the second conductive pads 335 via third conductive vias 326 formed in openings of the third dielectric layer 316. In some embodiments, the third conductive patterns 336 may interconnect distant (not adjacent) semiconductor dies 100. In some embodiments, additional seal vias 344 (e.g. seal vias 344i, 344o), 346 (e.g. seal vias 346i, 346o) and seal patterns 354 (e.g. patterns 354i, 354o), 356 (e.g. patterns 356i, 356o) may be sequentially formed and alternately stacked over the seal patterns 352 to form an inner seal ring SRi and outer seal ring SRo (sometimes collectively referred to as seal ring(s) SR).

Figure 1G:
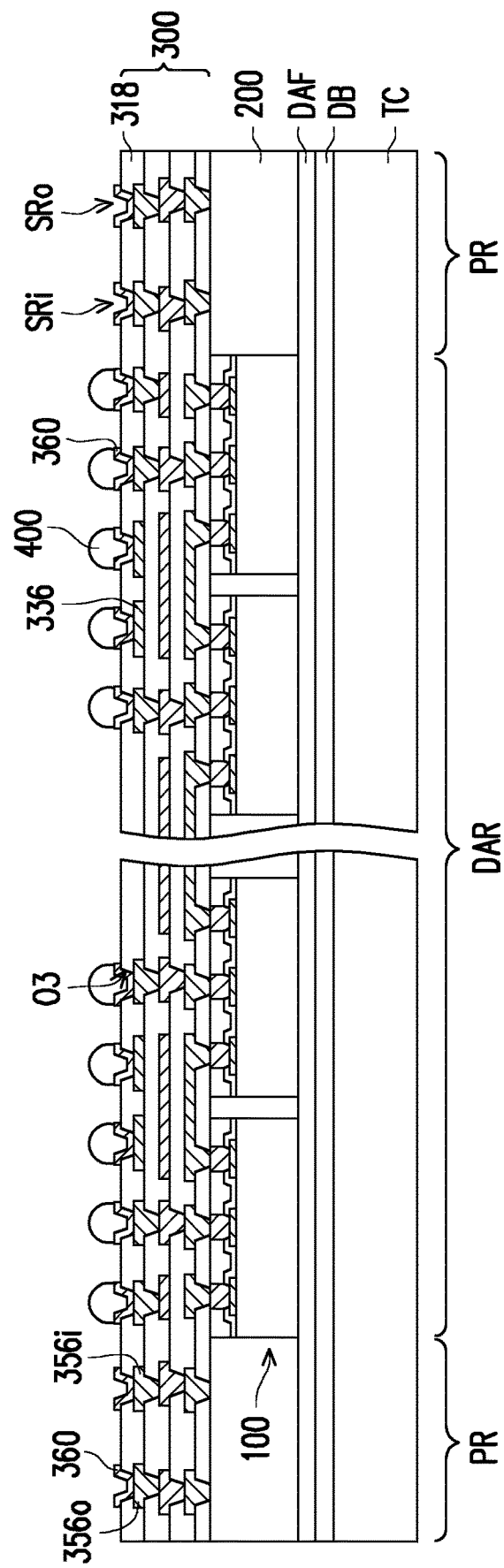

In some embodiments, referring to FIG. 1F and FIG. 1G, the outermost dielectric material layer 318a may be patterned to form an outermost dielectric layer 318 exposing the underlying third conductive patterns 336 and third seal patterns 356 through openings O3. In some embodiments, under-bump metallurgies 360 may optionally be conformally formed in the openings O3 exposing the third conductive patterns 336. In some embodiments, the under-bump metallurgies 360 may further extend over portions of the outermost dielectric layer 318 surrounding the openings O3. In some embodiments, the under-bump metallurgies 360 may be formed also over the topmost seal patterns 356i, 356o. In some embodiments, connectors 400 are formed over the under-bump metallurgies in the die attach region DAR. The connectors 400 may include solder balls, ball grid array (BGA) connectors, metal pillars, controlled collapse chip connection (C4) bumps, micro bumps, bumps formed via electroless nickel-electroless palladium-immersion gold technique (ENEPIG), a combination thereof (e. g, a metal pillar with a solder ball attached), or the like. In some embodiments, formation of the connectors 400 over the under-bump metallurgies 360 formed on the seal patterns 356i, 356o is skipped. Therefore, the under-bump metallurgies 360 overlying the seal rings SRi, SRo may be left exposed. In some embodiments, formation of the outermost dielectric layer 318 may complete the redistribution structure 300 according to some embodiments of the disclosure. In some embodiments, the redistribution structure 300 may further include the under-bump metallurgies 360.

Based on the above description, referring to FIG. 1F and FIG. 1G, the redistribution structure 300 may interconnect the semiconductor dies 100 with each other as well as with the connectors 400. The first conductive vias 322 may connect the first conductive patterns 332 and the first conductive pads 333 to the semiconductor dies 110. The first conductive patterns 332 may be used to interconnect adjacent semiconductor dies in a first redistribution layer 302 of the redistribution structure 300. The first conductive pads 333 may be used to provide vertical electrical connection to higher redistribution layers (304, 306) of the redistribution structure 300, and, possibly, to the connectors 400. A portion of the first conductive pads 333 may be connected to a ground plane GP through conductive vias 324. A second portions of the first conductive pads 333 may be connected to the second conductive pads 335. The second conductive pads 335 may be physically disconnected from (not in direct contact with) the ground pland GP, and may serve to provide vertical electrical connection to higher redistribution layers (e.g., 306) of the redistribution structure 300. The third conductive patterns 336 may be connected to the second conductive pads 335 by the conductive vias 326. Connectors 400 may electrically contact the third conductive patterns 336, optionally via interposed under-bump metallurgies 360. Alternatively stated, connection between the semiconductor dies 100 and the connectors 400 may be realized by conductive vias 322, 324, 326 alternately stacked with the conductive pads 333, 335, and the conductive patterns 336. In some embodiments, the first redistribution layer 302 which interconnects adjacent semiconductor dies 100 is the redistribution layer closer to the semiconductor dies 100. In some embodiments, the first conductive patterns 332 of the first redistribution layer 302 interconnect each semiconductor dies 100 with all the semiconductor dies 100 directly faced. It should be noted that the number of redistribution layers 302, 304, 306 illustrated in the drawings is merely for illustrative purposes, and the disclosure is not limited thereto. In some alternative embodiments, more or fewer redistribution layers are formed depending on the circuit design. Furthermore, the structures and functions of the redistribution layers 302, 304, 306 are not limited to the ones just described. In some alternative embodiments, one of the higher redistribution layers (e.g., the second redistribution layer 304) may establish the single-ended connection between adjacent semiconductor dies 100, and another redistribution layer (e.g., the first redistribution layer 302) may act as a ground plane GP for the semiconductor dies 100.

Figure 1H:
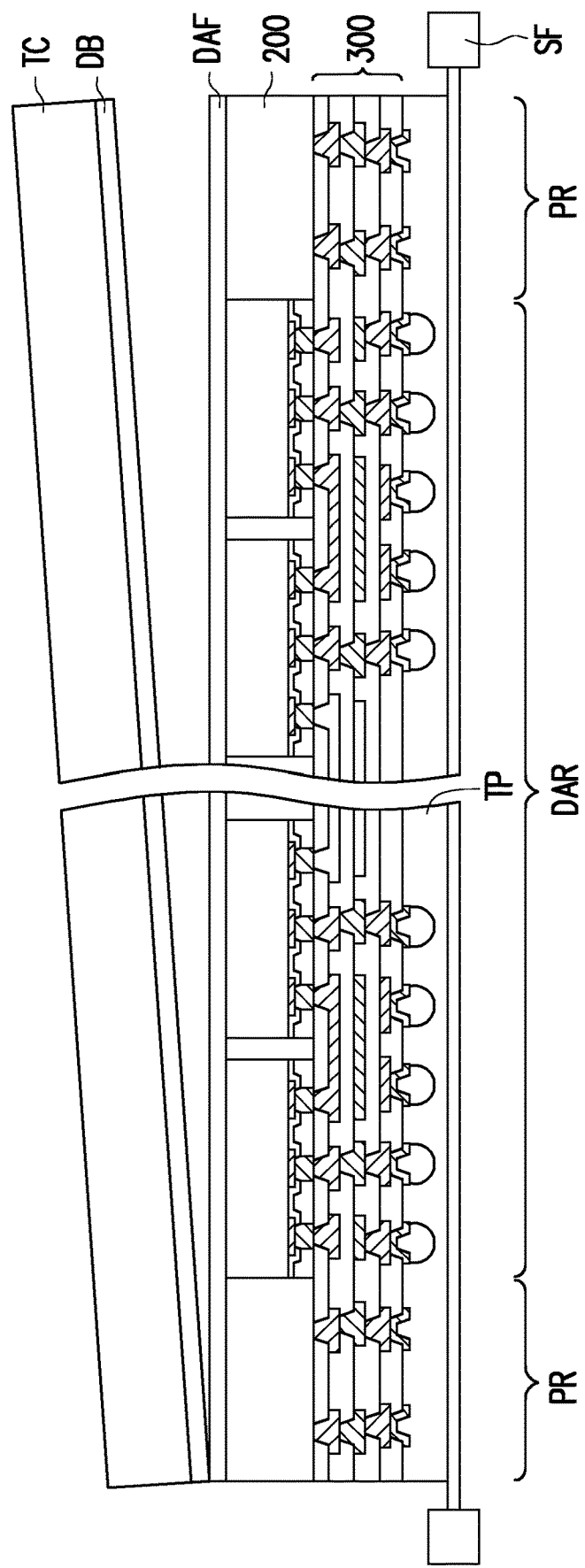
Figure 1I:
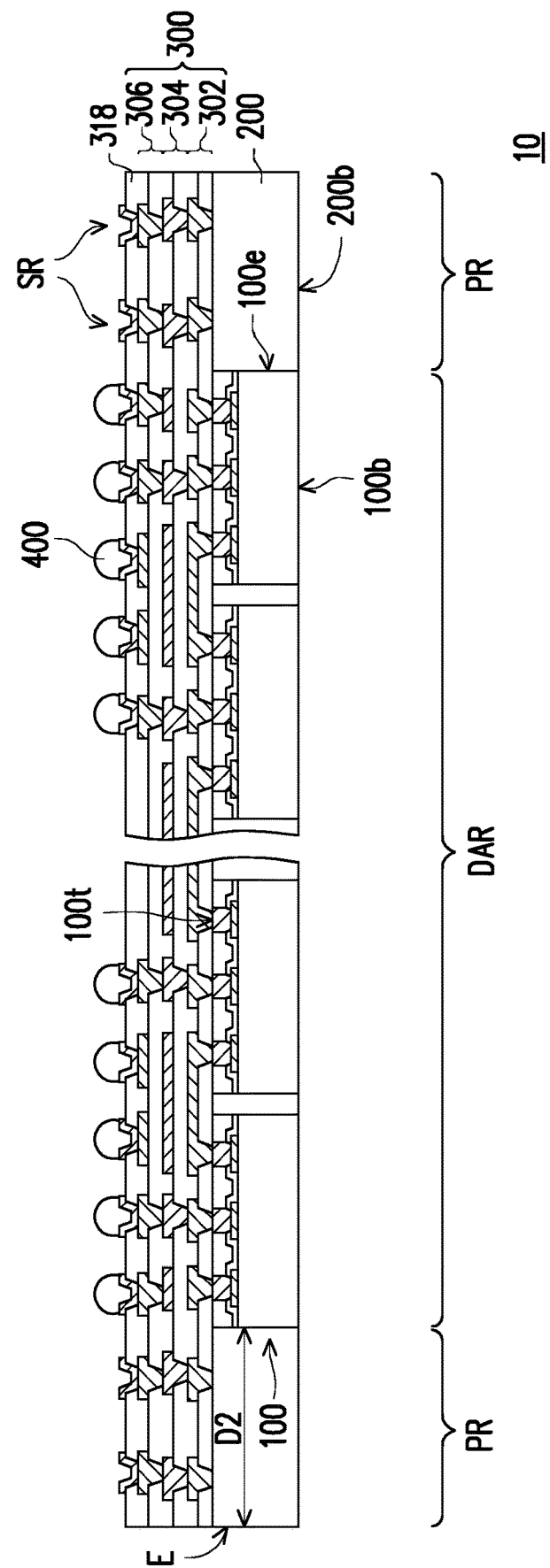

Referring to FIG. 1G and FIG. 1H, the surface of the redistribution structure 300 where the connectors 400 have been formed may be embedded in a protective tape TP, and the semiconductor package being formed may be overturned over a supporting frame SF to continue the manufacturing process. In some embodiments, the de-bonding layer DB (e.g., the LTHC release layer) is irradiated with radiation of appropriate wavelength, so that the temporary carrier TC and the de-bonding layer DB are easily peeled off from the die attach film DAF. Nevertheless, the de-bonding process is not limited thereto, and other suitable de-bonding methods may be used in some alternative embodiments. Removal of the temporary carrier TC exposes the die attach film DAF, which becomes then available for further processing. Referring to FIGS. 1H and 1I, in some embodiments, the die attach film DAF may be removed, thus obtaining a semiconductor package 10. However, the disclosure is not limited thereto. In some alternative embodiments, the die attach film DAF may be retained. With the removal of the die attach film DAF, backside surfaces 100b of the semiconductor dies 100 and the bottom surface 200b of the encapsulant 200 may be exposed.

Figure 1J:
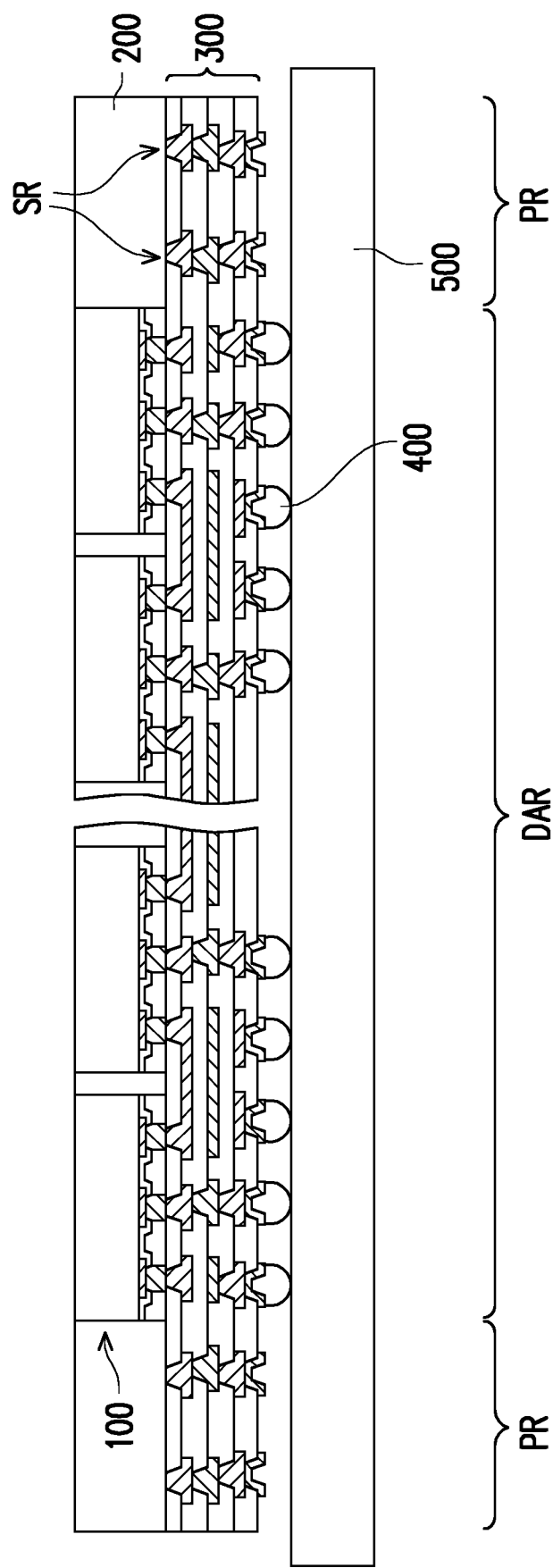
FIG. 1J is a schematic cross-sectional view of a semiconductor package connected to a circuit carrier according to some embodiments of the present disclosure.

In FIG. 1I is shown a semiconductor package 10 according to some embodiments of the disclosure. In some embodiments, the semiconductor package 10 may be a large-scale Integrated Fan-Out (InFO) package. In some embodiments, an area (a footprint) of the semiconductor package 10 may be in the range from 0.1 to 70650 mm². In some embodiments, the semiconductor package 10 may have a rectangular shape, a square shape, or a circular shape. The semiconductor package 10 may include a die attach region DAR in which the semiconductor dies 100 are disposed. The die attach region DAR may be surrounded by a peripheral region PR. In some embodiments, a border between the die attach region DAR and the peripheral region PR is defined by the outer side surfaces 100e of the semiconductor dies 100. In some embodiments, a distance D2 between the outer side surfaces 100e and the edge E of the semiconductor package 10 (a width of the peripheral region PR) is in the range from 2 to 150 mm. The semiconductor dies 100 may be wrapped by an encapsulant 200 and interconnected via a redistribution structure 300 disposed on the encapsulant 200 and the active surfaces 100t of the semiconductor dies 100. In some embodiments, most adjacent semiconductor dies 100 are interconnected by the first conductive patterns 332 included in the first layer 302 of the redistribution structure 300 according to a single-ended signaling scheme. In some embodiments, by connecting most adjacent semiconductor dies 100 according to a single-ended signaling scheme, the power consumption of the semiconductor package 10 can be reduced. In some embodiments, the first conductive pattern 332 are located within the die attach region DAR. In some embodiments, the first redistribution layer 302 of the redistribution structure 300 interconnects most adjacent semiconductor dies 100, whilst upper redistribution layers (e.g., 306) of the redistribution structure 300 provide connection between distant (non adjacent) semiconductor dies 100. In some embodiments, the single-ended connection scheme allows a distance D1 (shown in FIG. 1A) between adjacent semiconductor dies 100 to be in the range from 30 to 70 micrometers. The shorter distance D1 between adjacent semiconductor dies 100 may increase the number of semiconductor dies 100 which may be included within the semiconductor package 10. In some embodiments, realization of the single-ended connection between adjacent semiconductor dies 100 via InFO technology increases the reliability of the semiconductor package for shorter distances D1 between adjacent semiconductor dies 100. According to some embodiments, the semiconductor package 10 may be connected to a circuit substrate 500 such as a motherboard, a printed circuit board, or the like, as shown in FIG. 1J.

In FIG. 2 is illustrated a schematic top view of the semiconductor package 10 according to some embodiments of the disclosure. The schematic top view of FIG. 2 is taken in the plane XY defined by the first direction X and the second direction Y as discussed above with reference to FIG. 1A. For the sake of clarity, in FIG. 2 are only illustrated the span of the encapsulant 200, a schematic position of the seal ring, SR, the positions of the semiconductor dies 100, and the interconnections provided by the first conductive patterns 332. As illustrated in FIG. 2, in some embodiments, a semiconductor package 10 may include m×n semiconductor dies 100 disposed side by side in m rows and n columns defining an (m×n) matrix. In some embodiments, the distance D1x between most adjacent semiconductor dies 100 along the first direction X is the same as the distance D1y between most adjacent semiconductor dies 100 along the second direction Y, but the disclosure is not limited thereto. In some alternative embodiments, the distance D1x may differ from the distance D1y. In some embodiments, the semiconductor dies 100 may be referred to based on the coordinates occupied in the (m×n) matrix. For example, the semiconductor die (1,1) may be the semiconductor die 100 located in the first position (first column) of the first row. Similarly, the semiconductor die (1,2) may be the semiconductor die 100 located in the second position (second column) of the first row. In some embodiments, the semiconductor die (1,1) has one most adjacent semiconductor die 100 (the semiconductor die (1,2)) along the first direction X and one most adjacent semiconductor die 100 (the semiconductor die (2,1)) along the second direction Y. Therefore, the semiconductor die (1,1) has two inner side surfaces 100i and two outer side surfaces 100e. Similarly, the semiconductor die (1,2) is most adjacent to three semiconductor dies 100 (the semiconductor dies (1,1), and (1,3) along the first direction X and the semiconductor die (2,2) along the second direction Y), and has, therefore, three inner side surfaces 100i and one outer side surface 100e. In some embodiments, the semiconductor die (2,2) has four most adjacent semiconductor dies 100 (the semiconductor dies (1,2), (3,2), (2,1) and (2,3)), and has four inner side surfaces 100i. In FIG. 2 the semiconductor dies 100 are illustrated as having a rectangular shape. However, other shapes for the semiconductor dies 100 are also contemplated within the disclosure, and the number of side surfaces is not necessarily limited to four. As shown in FIG. 2, in some embodiments the first conductive patterns 332 may avoid crossing outer side surfaces 100e, and may only interconnect most adjacent semiconductor dies 100. In some embodiments, the first conductive patterns 332 establish for each semiconductor die 100 a direct connection with all the most adjacent (directly faced) semiconductor dies 100.

Figure 3:
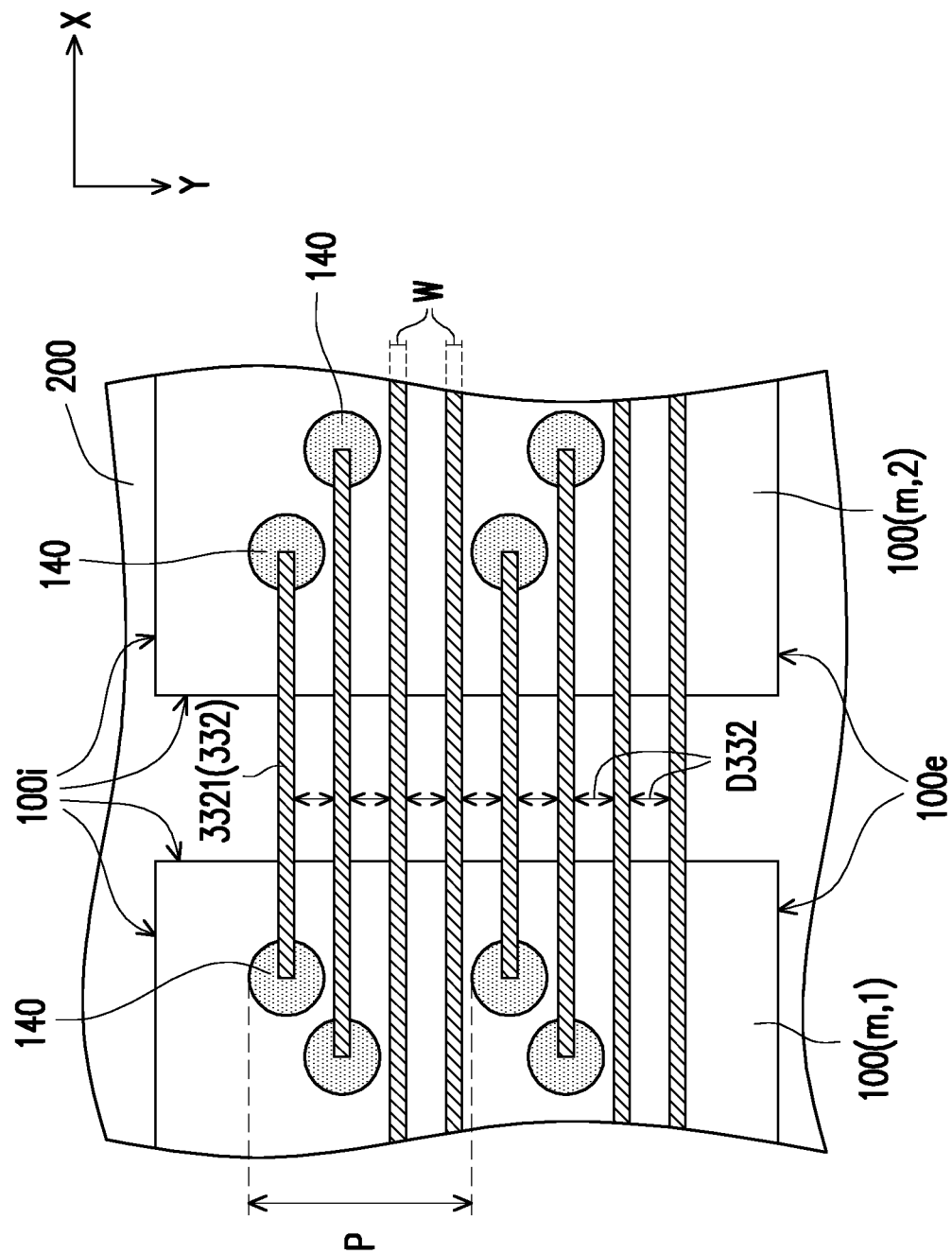
FIG. 3 is a schematic top view of portion of a semiconductor package according to some embodiments of the present disclosure.

In FIG. 3 are shown further details of the portion of the semiconductor package 10 corresponding to the area A shown in FIG. 2. FIG. 3 illustrates some aspects of the interconnection of two adjacent semiconductor dies 100 (i.e., the semiconductor dies (m,1) and (m,2)) according to some embodiments of the disclosure. In FIG. 3 the first conductive patterns 332 connecting the two semiconductor dies (m,1) and (m,2) are shown extending parallel to each other along the first direction X over the encapsulant 200. In some embodiments, the first conductive patterns 332 interconnecting two semiconductor dies 100 may include multiple conductive strip patterns 3321. Each conductive strip pattern 3321 may have a first terminus connected to a conductive post 140 of the semiconductor die (m,1) and a second terminus connected to a conductive post 140 of the semiconductor die (m,2). In some embodiments, the connection between the conductive strip pattern 3321 and the conductive post 140 may happen through a conductive via 322 (shown in FIG. 1F). In some embodiments, the conductive strip patterns 3321 interconnecting adjacent semiconductor dies 100 along the first direction X may be equally spaced along the second direction Y. That is, a distance D332 along the second direction Y between pairs of conductive strip patterns 3321 interconnecting the same pair of semiconductor dies 100 (e.g., (m,1) and (m,2) in the view of FIG. 3) may be substantially constant, with a tolerance of about 10%. In some embodiments, conductive strip patterns 3321 interconnecting the same pair of semiconductor dies 100 may have substantially the same width W, with a tolerance of about 10%. In some embodiments, a pitch P between conductive posts 140 aligned along the second direction Y (or the first direction X), belonging to the same semiconductor die 100 (e.g., m,1) and connecting the same semiconductor die 100 (m,1) along the first direction X (or the second direction Y) with an adjacent semiconductor die 100 (e.g., m,2) may be in the range from 50 μm to 500 μm. In some embodiments, a width over space ratio (W/S) of the conductive strip patterns 3321 may be about 2/2, but the disclosure is not limited thereto. In some embodiments, between 1 to 30 conductive strip patterns 3321 may run along the first direction X (or the second direction Y) in between consecutive conductive posts 140, wherein the consecutive conductive posts 140 are aligned along the second direction Y (or the first direction X) and separated by the pitch P from each other.

Figure 4:
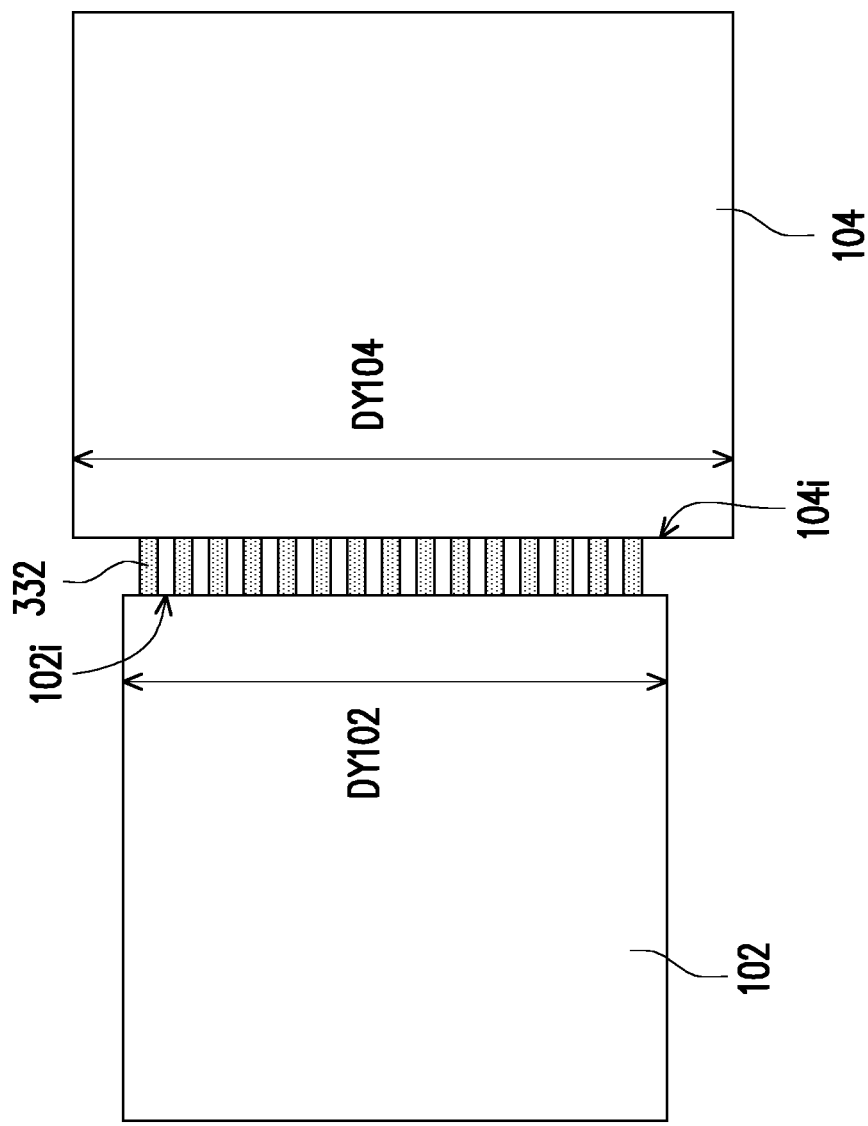
FIG. 4 through FIG. 6 are schematic top views of portions of semiconductor packages according to some embodiments of the present disclosure.

In FIG. 4 is shown a pair of most adjacent semiconductor dies 102, 104 interconnected in a semiconductor package according to some embodiments of the disclosure. The semiconductor dies 102, 104 shown in FIG. 4 may be any pair of the semiconductor dies 100 included in the semiconductor packages of the present disclosure. The semiconductor dies 102, 104 may be interconnected in a single-ended scheme by the conductive patterns 332 along the first direction Y. Whilst only two semiconductor dies 102, 104 are shown in FIG. 4, other semiconductor dies (not shown) may be disposed beside them along the first direction X, the second direction Y or both, and other conductive patterns (not shown) may establish a single-ended connection between the semiconductor dies 102, 104 and these other semiconductor dies. According to some embodiments, a dimension DY102 of the semiconductor die 102 along the second direction Y differs from a dimension DY104 of the semiconductor die 104 along the second direction Y. In some embodiments, the dimensions DY102 or DY104 are measured as the distance between opposite side surfaces extending in the XZ plane of the semiconductor die 102 or 104. In some embodiments, the semiconductor dies 102, 104 still have inner side surfaces 102i, 104i facing each other, but the inner side surface 104i of the semiconductor die 104 protrudes in the second direction Y with respect to the semiconductor die 102. In some embodiments not illustrated in FIG. 4, a similar configuration is possible for semiconductor dies 100 interconnected along the second direction Y and having mismatching dimensions along the first direction X.

Figure 5:
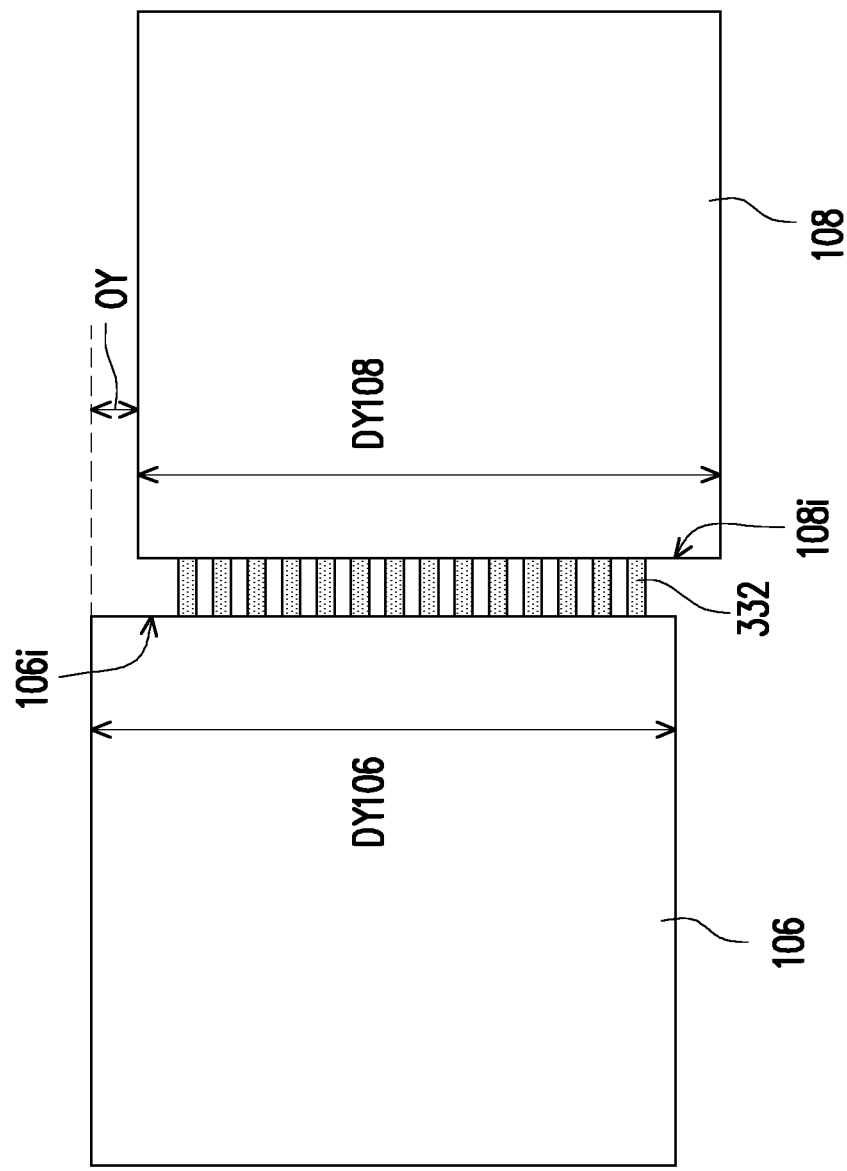

In FIG. 5 is shown a pair of most adjacent semiconductor dies 106, 108 interconnected in a semiconductor package according to some embodiments of the disclosure. The semiconductor dies 106, 108 shown in FIG. 4 may be any pair of the semiconductor dies 100 included in the semiconductor packages of the present disclosure. The semiconductor dies 106, 108 may be interconnected in a single-ended scheme by the conductive patterns 332 along the first direction X. Whilst only two semiconductor dies 106, 108 are shown in FIG. 5, other semiconductor dies (not shown) may be disposed beside them along the first direction X, the second direction Y or both, and other conductive patterns (not shown) may establish a single-ended connection between the semiconductor dies 106, 108 and these other semiconductor dies. According to some embodiments, the semiconductor dies 106, 108 may be disposed within the semiconductor package with an offset OY along the second direction Y. That is, the semiconductor dies 106, 108 may still have inner side surfaces 106i, 108i facing each other, but the inner side surface 106i of the semiconductor die 106 may not be completely aligned along the second direction X (offset along the second direction Y) to the inner side surface 108i of the semiconductor die 108. In some embodiments, the offset OY may be greater than 0.1 micrometers. In some embodiments, a dimension DY106 of the semiconductor die 106 along the second direction Y may be substantially equal to a dimension DY108 of the semiconductor die 108 along the second direction Y. In some alternative embodiments, the dimension DY106 may be different from the dimension DY108. In some embodiments not illustrated in FIG. 5, a similar configuration may be possible for semiconductor dies interconnected along the second direction Y and being offset along the first direction X.

Figure 6:
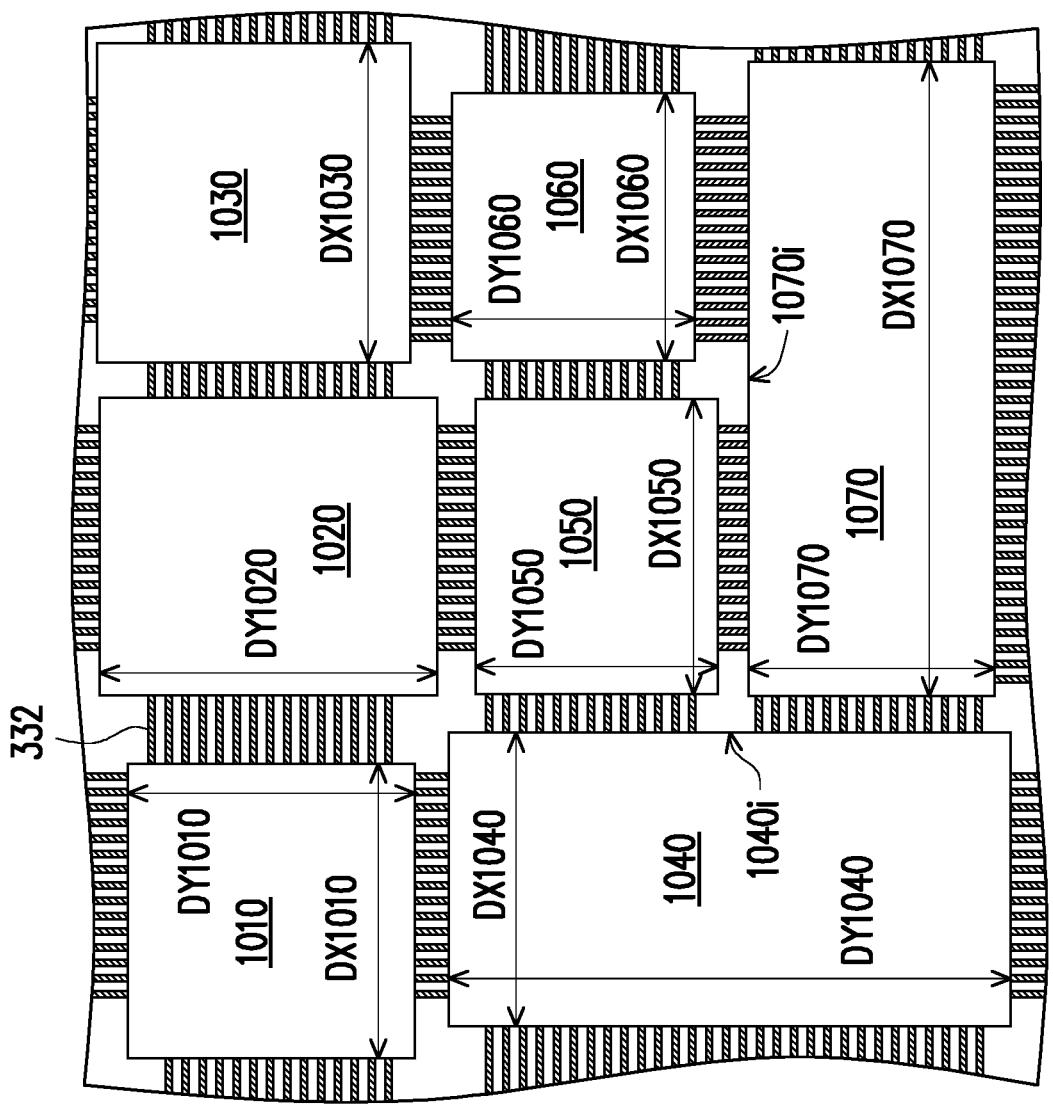

In FIG. 6 is shown a portion of a schematic top view of a semiconductor package 20 according to some embodiments of the disclosure. For the sake of clarity, in the schematic top view of FIG. 6, only the positions of the semiconductor dies 1010, 1020, 1030, 1040, 1050, 1060, 1070 and conductive patterns 332 are illustrated. As illustrated in FIG. 6, in some embodiments, dimensions and positions of the semiconductor dies 1010, 1020, 1030, 1040, 1050, 1060, 1070 may vary along the first direction X, the second direction Y, or both. In the description of FIG. 6, the dimensions of the semiconductor dies along the first direction X and the second direction Y will be referred to as first dimension DX and second dimension DY, respectively. For example, the dimension DX1010 of the semiconductor die 1010 along the first direction X will be referred to as first dimension DX1010. In some embodiments, the first dimension DX1010 of the semiconductor die 1010 is substantially equal to the second dimension DX1040 of the most adjacent semiconductor die 1040, and the two semiconductor dies 1010 and 1040 may be misaligned along the second direction Y. In some embodiments, the second dimension DY1010 of the semiconductor die 1010 may be smaller than the second dimension DY1020 of the most adjacent semiconductor die 1020. In some embodiments, the semiconductor dies 1050 and 1070 may be most adjacent to the semiconductor die 1040 along the first direction X and face the same inner side surface 1040i of the semiconductor die 1040. That is, a portion of the conductive patterns 332 crossing over the inner side surface 1040i of the semiconductor die 1040 may connect the semiconductor die 1040 with the semiconductor die 1050, and a second portion of the conductive patterns 332 crossing over the same inner side surface 1040i may connect the semiconductor die 1040 with the semiconductor die 1070. In some embodiments, a number of most adjacent semiconductor dies 100 for a given semiconductor die 100 may exceed the number of inner side surfaces 100i of the given semiconductor die 100. In some embodiments, a sum of the second dimensions DY1050 and DY1070 of the semiconductor dies 1050 and 1070 may be smaller than the second dimension DY1040 of the semiconductor die 1040, but the disclosure is not limited thereto. Similarly, the semiconductor die 1070 may be connected through the same inner side surface 1070i to both of the semiconductor dies 1050 and 1060, for example along the second direction Y. In some embodiments, the semiconductor dies 1060 and 1050 have similar second dimensions DY1050, DY1060 and are offset along the second direction Y. In some embodiments, the first dimension DX1060 of the semiconductor die 1060 is smaller than the first dimension DX1030 of the adjacent semiconductor die 1030.

Figure 7:
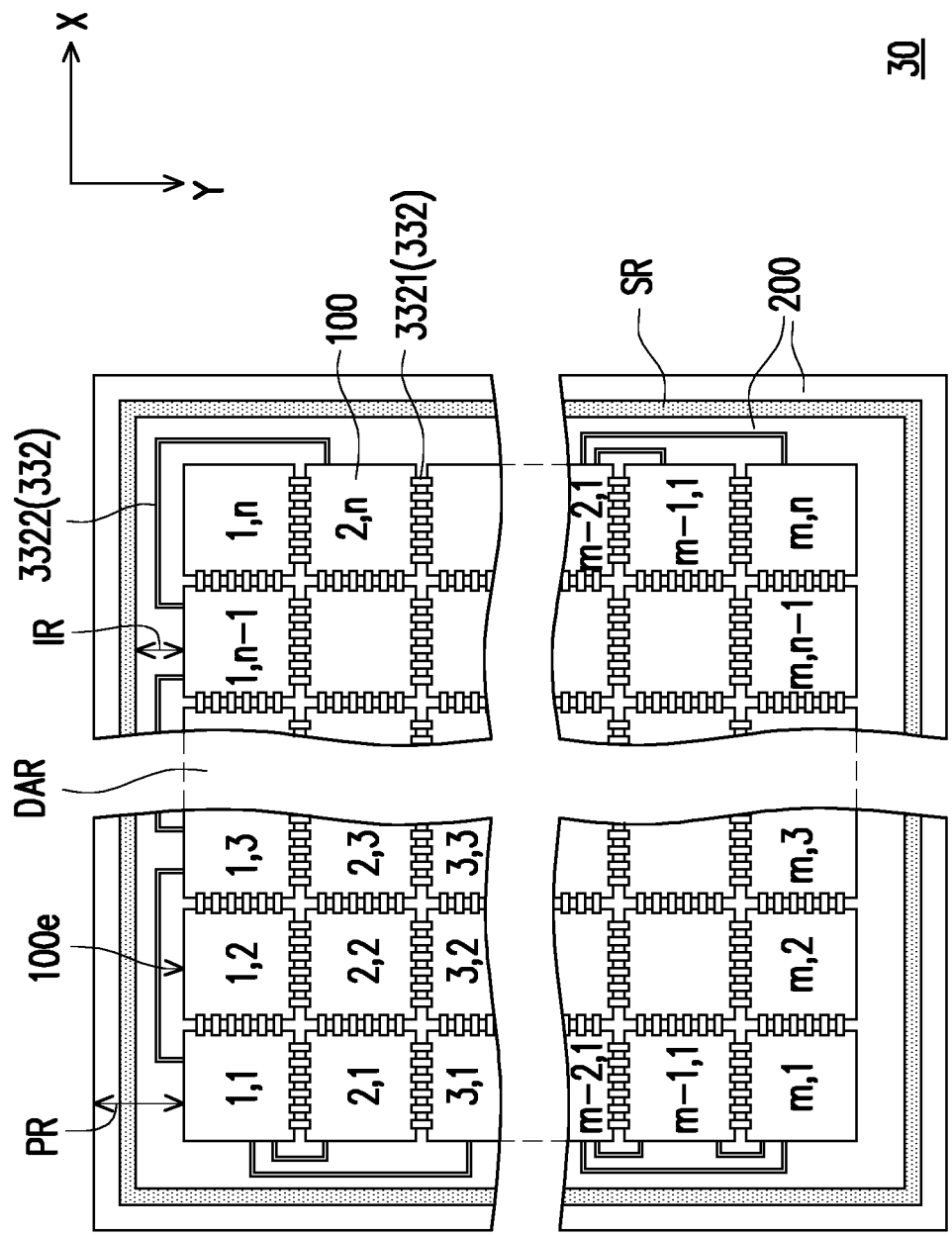
FIG. 7 is a schematic top view of a semiconductor package according to some embodiments of the present disclosure.

In FIG. 7 is illustrated a schematic top view of a semiconductor package 30 according to some embodiments of the disclosure. The schematic top view of FIG. 7 is taken in the plane XY defined by the first direction X and the second direction Y as discussed above with reference to FIG. 1A. For the sake of clarity, in FIG. 7 are only illustrated the span of the encapsulant 200, a schematic position of the seal ring, SR, the positions of the semiconductor dies 100, and the interconnections provided by the first conductive patterns 332. In the semiconductor package 30 of FIG. 7, the conductive strip patterns 3321 of the first conductive patterns 332 may run through the die attach region DAR establishing single-ended connections between most adjacent semiconductor dies 100. A difference between the semiconductor package 10 of FIG. 2 and the semiconductor package 30 of FIG. 7 is that the first conductive patterns 332 include interconnecting conductive patterns 3322 extending from the die attach region DAR to the peripheral region PR to interconnect distant (non-adjacent) semiconductor dies 100. For example, some interconnecting conductive patterns 3322 may run through the peripheral region PR to interconnect the semiconductor die (1,1) with the semiconductor die (1,3) and the semiconductor die (3,1), the semiconductor die (m−2,1) with the semiconductor die (m,1), the semiconductor die (1,n−1) with the semiconductor die (2,n), and so on. In some embodiments, some interconnecting conductive patterns 3322 (i.e., some of the first conductive patterns 332 running through the peripheral region PR) also connect most adjacent semiconductor dies 100, such as the semiconductor die (1,1) with the semiconductor die (2,1), the semiconductor die (m−1,1) with the semiconductor die (m,1), and so on. In some embodiments, the peripheral region PR may include an interconnect region IR extending from the outer side surfaces 100e of the semiconductor dies 100 until the seal ring SR. The interconnecting conductive patterns 3322 may run through the interconnect region IR. In some embodiments, the interconnecting conductive patterns 3322 may be considered as fan-out patterns interconnecting the most adjacent semiconductor dies (e.g. semiconductor dies (1,1) and (2,1)) or neighboring (i.e. not most adjacent) semiconductor dies 100 (e.g. semiconductor dies (1,1) and (1,3) or (1,1) and (3,1)). In some embodiments, the interconnecting conductive patterns 3322 of the first conductive patterns 332 may establish non-single-ended connections between semiconductor dies 100.

Figure 8:
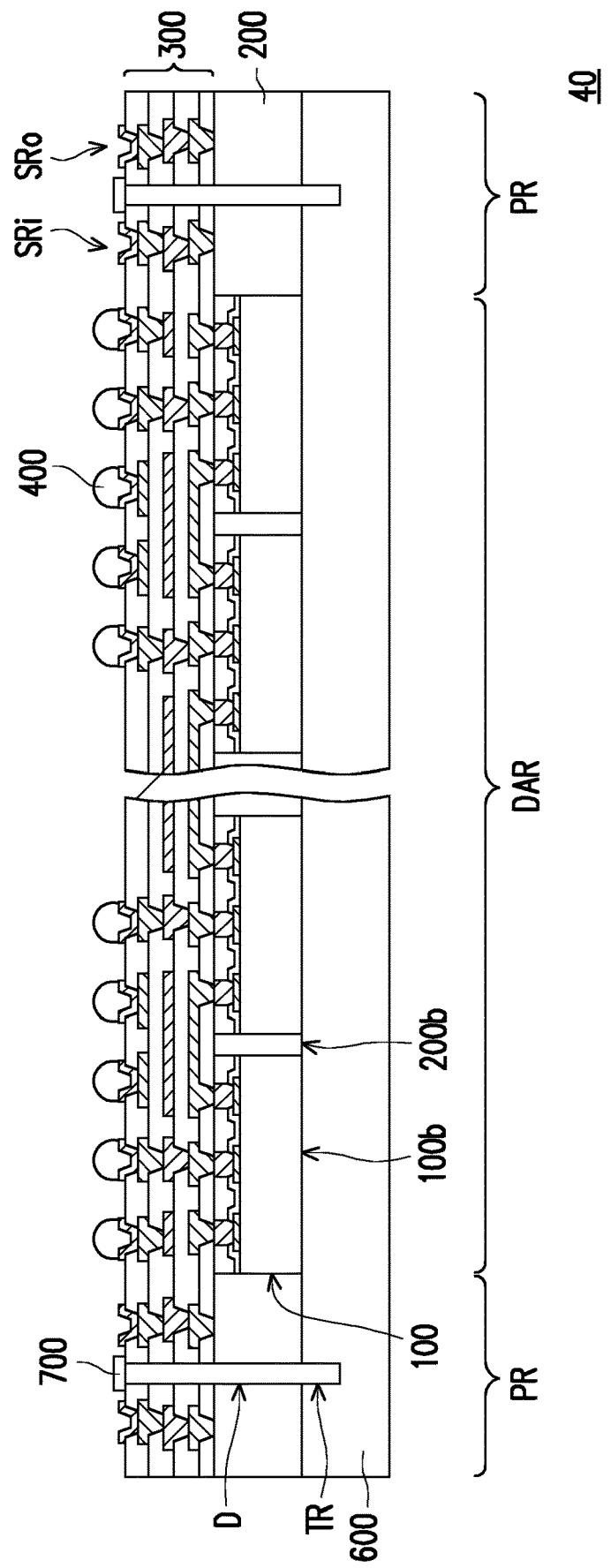
FIG. 8 is a schematic cross-sectional view of a semiconductor package according to some embodiments of the present disclosure.

In FIG. 8 is shown a cross-sectional view of a semiconductor package 40 according to some embodiments of the disclosure. A difference between the semiconductor package 10 of FIG. 1I and the semiconductor package 40 of FIG. 8 is that an additional device 600 is disposed against the backside surfaces 100b of the semiconductor dies 100 and the bottom surface 200b of the encapsulant 200. In some embodiments, the device 600 is not particularly limited. In some embodiments, the device 600 is a heat-dissipation device such as a heat sink, a heat spreader or the like or another suitable component or module. In some embodiments, the device 600 may be secured to the semiconductor package 40 via a fastener 700 penetrating through the semiconductor package 40. In some embodiments, ducts D are formed within the peripheral region PR of the semiconductor package 40. In some embodiments, the ducts D open throughout the redistribution structure 300 and the encapsulant 200. In some embodiments, the ducts D open in between the inner seal ring SRi and the outer seal ring SRo. In some embodiments, the ducts D are aligned with a trench TR formed in the device 600. In some embodiments, the fastener 700 (e.g., a screw) may fill the ducts D and be received in the trench TR. In some embodiments, the trench TR, the ducts D or both may present a thread complementary to a thread formed on the fastener 700.

In light of the foregoing, the single-ended connection scheme allows reduction of a distance between adjacent semiconductor dies, and a die count (i.e., a number of semiconductor dies included) of the semiconductor packages of the present disclosure may increase. In some embodiments, the increased die count may boost the computing power of the semiconductor packages. In some embodiments, single-ended connection of the semiconductor dies may reduce the power consumption of the semiconductor packages. In some embodiments, the semiconductor packages may be manufactured as large scale Integrated Fan-Out (InFO) packages, without increase in manufacturing costs.

In accordance with some embodiments of the disclosure, a semiconductor package is provided. The semiconductor package includes semiconductor dies, an encapsulant and a redistribution structure. The semiconductor dies are disposed side by side. Each semiconductor die has an active surface, a backside surface, and an inner side surface connecting the active surface and the backside surface. The encapsulant wraps the semiconductor dies and exposes the active surfaces of the semiconductor dies. The redistribution structure is disposed on the encapsulant and the active surfaces of the semiconductor dies. The inner side surfaces of most adjacent semiconductor dies face each other. The redistribution structure establishes single-ended connections between the most adjacent semiconductor dies by crossing over the facing inner side surfaces of the most adjacent semiconductor dies.

In accordance with some embodiments of the disclosure, a semiconductor package is provided. The semiconductor package includes semiconductor dies, an encapsulant and a redistribution structure. The semiconductor dies are disposed in an array manner. The encapsulant wraps the semiconductor dies and exposes active surfaces of the semiconductor dies. The redistribution structure is disposed on the encapsulant and the active surfaces of the semiconductor dies. The redistribution structure includes multiple redistribution layers having conductive patterns. The conductive patterns of a single redistribution layer contact and interconnect semiconductor dies disposed next to each other.

In accordance with some embodiments of the disclosure, a manufacturing method of a semiconductor package is provided. The method includes at least the followings. An array of semiconductor dies is provided. Each semiconductor die has an active surface, a backside surface, and an inner side surface connecting the active surface and the backside surface. An encapsulant is formed. The encapsulant wraps the semiconductor dies and exposes active surfaces of the semiconductor dies. Conductive patterns are formed contacting one semiconductor die of the array of semiconductor dies and the semiconductor dies next to the one semiconductor die and crossing over inner side surfaces of the one semiconductor die and the semiconductor dies next to the one semiconductor die to interconnect the one semiconductor die and the semiconductor dies next to the one semiconductor die. The conductive patterns are formed into conductive strip patterns parallel with respect to each other along a first direction with a substantial equal spacing with respect to each other along a second direction perpendicular to the first direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   semiconductor dies disposed side by side along a first direction and a second direction perpendicular to the first direction, wherein each semiconductor die has an active surface, a backside surface, and an inner side surface connecting the active surface and the backside surface;
   an encapsulant wrapping the semiconductor dies and exposing the active surfaces of the semiconductor dies; and
   a redistribution structure, disposed on the encapsulant and the active surfaces of the semiconductor dies,
   wherein the inner side surfaces of most adjacent semiconductor dies face each other, the redistribution structure establishes single-ended connections between the most adjacent semiconductor dies by crossing over the facing inner side surfaces of the most adjacent semiconductor dies,
   wherein the single-ended connections between two of the most adjacent semiconductor dies include first conductive patterns running parallel with respect to each other along the first direction, equally spaced with respect to each other along the second direction, and located in a same layer of the redistribution structure, and
   wherein the semiconductor dies are disposed in an array manner, one semiconductor die of the semiconductor dies has at least three most adjacent semiconductor dies, and the single-ended connections cross over the inner side surfaces of the one semiconductor die and the at least three most adjacent semiconductor dies.

2. The semiconductor package of claim 1, wherein a distance between two most adjacent semiconductor dies is in the range from 30 micrometers to 70 micrometers.

3. The semiconductor package of claim 1, wherein the semiconductor dies are disposed in the array manner along the first direction and the second direction perpendicular to the first direction, and a first semiconductor die has a first dimension larger than a first dimension of an adjacent second semiconductor die.

4. The semiconductor package of claim 1, wherein the semiconductor dies are disposed in the array manner along the first direction and the second direction perpendicular to the first direction, a first semiconductor die is adjacent to a second semiconductor die along the first direction, and the first semiconductor die is offset with respect to the second semiconductor die along the second direction.

5. The semiconductor package of claim 1, wherein the single-ended connections between other two of the most adjacent semiconductor dies include second conductive patterns running parallel with respect to each other along the first direction, and equally spaced with respect to each other along the second direction.

6. The semiconductor package of claim 5, wherein the second conductive patterns are located in the same layer of the redistribution structure as the first conductive patterns, and the second conductive patterns are as thick as the first conductive patterns along a third direction perpendicular to the first direction and the second direction.

7. A semiconductor package, comprising:
   semiconductor dies disposed in an array manner;
   an encapsulant wrapping the semiconductor dies and exposing active surfaces of the semiconductor dies; and
   a redistribution structure, disposed on the encapsulant and the active surfaces of the semiconductor dies,
   wherein the redistribution structure includes multiple redistribution layers having conductive patterns, the conductive patterns of a single redistribution layer contact and interconnect semiconductor dies disposed next to each other,
   a pair of the semiconductor dies disposed next to each other is interconnected by at least some of the conductive patterns of the single redistribution layer,
   the conductive patterns of the single redistribution layer interconnecting the pair of semiconductor dies include multiple first conductive strip patterns running parallel with respect to each other along a first direction, equally spaced with respect to each other along a second direction perpendicular to the first direction, and having a same thickness along a third direction perpendicular to the first direction and the second direction, another pair of the semiconductor dies disposed next to each other is interconnected by at least some other of the conductive patterns of the single redistribution layer, and the other conductive patterns of the single redistribution layer interconnecting the other pair of the semiconductor dies include multiple second conductive strip patterns running parallel with respect to each other along the second direction and equally spaced with respect to each other along the first direction.

8. The semiconductor package of claim 7, wherein the multiple first conductive strip patterns have a same width with respect to each other along the second direction.

9. The semiconductor package of claim 7, wherein the semiconductor package has a die attach region and a peripheral region surrounding the die attach region, the semiconductor dies are disposed in the die attach region of the semiconductor package, and the conductive patterns of the single redistribution layer are located within the die attach region.

10. The semiconductor package of claim 9, wherein the single redistribution layer includes interconnecting conductive patterns extending from the die attach region to the peripheral region.

11. The semiconductor package of claim 9, wherein the semiconductor package includes a seal ring structure surrounding the semiconductor dies.

12. The semiconductor package of claim 11, wherein the seal ring structure is located in the peripheral region.

13. The semiconductor package of claim 7, wherein the single redistribution layer is the redistribution layer closest to the semiconductor dies.

14. The semiconductor package of claim 13, wherein the redistribution layer disposed over the single redistribution layer includes a ground plane.

15. A semiconductor package, comprising:
semiconductor dies disposed in an array manner and comprising contact pads exposed at active surfaces of the semiconductor dies, wherein a first semiconductor die and a second semiconductor die of the semiconductor dies are next to each other along a first direction, and a third semiconductor die of the semiconductor dies is next to the first semiconductor die along a second direction perpendicular to the first direction;
an encapsulant laterally wrapping the semiconductor dies, wherein a top surface of the encapsulant is located at a same level height as the active surfaces of the semiconductor dies along a third direction perpendicular to the first direction and the second direction; and
a redistribution structure, comprising:
a bottommost dielectric layer, disposed on the encapsulant and the semiconductor dies, and including first openings exposing at least portions of the contact pads of the semiconductor dies; and
conductive strips, disposed on the bottommost dielectric layer and connected at opposite ends to contacts pads of different semiconductor dies of the semiconductor dies,
wherein opposite ends of first conductive strips of the conductive strips contact the first semiconductor die and the second semiconductor die, the first conductive strips extend parallel to each other along the first direction and are equally spaced with respect to each other along the second direction, and
opposite ends of second conductive strips of the conductive strips contact the first semiconductor die and the third semiconductor die, the second conductive strips extend parallel to each other along the second direction and are equally spaced with respect to each other along the first direction.

16. The semiconductor package of claim 15, wherein the second semiconductor die is disposed between the first semiconductor die and a fourth semiconductor die of the semiconductor dies along the first direction, and
opposite ends of third conductive strips of the conductive strips contact the first semiconductor die and the fourth semiconductor die.

17. The semiconductor package of claim 16, wherein the semiconductor package has a die attach region and a peripheral region surrounding the die attach region, the semiconductor dies are disposed in the die attach region, the first conductive strips and the second conductive strips are disposed in the die attach region, and the third conductive strips extend through the peripheral region.

18. The semiconductor package of claim 16, wherein the bottommost dielectric layer comprises second openings exposing portions of the encapsulant, and the redistribution structure further comprises seal ring patterns filling the second openings and electrically insulated from the semiconductor dies.

19. The semiconductor package of claim 18, wherein under-bump metallurgies are formed on the redistribution structure, electrically connected to the seal ring patterns.

* * * * *